United States Patent
Kim

(10) Patent No.: US 6,286,123 B1
(45) Date of Patent: Sep. 4, 2001

(54) CIRCUIT FOR CALCULATING ERROR POSITION POLYNOMIAL AT HIGH SPEED

(75) Inventor: Joo-Seon Kim, Kyonggi-do (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/132,674

(22) Filed: Aug. 12, 1998

(30) Foreign Application Priority Data

Jul. 13, 1997 (KR) .................................. 97-38584

(51) Int. Cl.[7] .................................................. H03M 13/00
(52) U.S. Cl. ............................ 714/781; 714/784; 714/785
(58) Field of Search ................................... 714/781, 752, 714/754, 755, 758, 761, 762, 765, 769, 782, 784, 785, 788, 795, 796; 375/262; 708/492

(56) References Cited

U.S. PATENT DOCUMENTS

| | | | |
|---|---|---|---|
| 5,463,642 | * 10/1995 | Gibbs et al. ........................ | 714/765 |
| 5,898,708 | * 4/1999 | Tateishi et al. ..................... | 714/752 |
| 5,983,383 | * 11/1999 | Wolf .................................. | 714/755 |
| 5,983,389 | * 11/1999 | Shimizu ............................. | 714/781 |
| 6,031,875 | * 2/2000 | Im ...................................... | 375/262 |

* cited by examiner

Primary Examiner—Emmanuel L. Moise
(74) Attorney, Agent, or Firm—Sughrue, Mion, Zinn, Macpeak & Seas, PLLC

(57) ABSTRACT

A circuit for calculating an error position polynomial at high speed. The error position polynomial is calculated by using the Berlekamp-Massey iterative algorithm of a serial structure to simplify calculation and obtain a high-speed operation. To correct a Reed-Solomon code, a syndrome calculator calculates a syndrome from a received word. An error position polynomial is then calculated from the syndrome by an error position polynomial calculator. An error position is retrieved from the error position polynomial and an error value of the retrieved error position is calculated by a error position retrieval and error value calculator. The error is corrected by adding an error position symbol to the error value via an error corrector, thereby generating the corrected code word.

5 Claims, 2 Drawing Sheets

CIRCUIT FOR CALCULATING ERROR POSITION POLYNOMIAL AT HIGH SPEED

BACKGROUND OF THE INVENTION

1. Field of the Invention

The present invention relates to a circuit for calculating an error position polynomial in an error correcting system using a Reed-Solomon code, and more particularly, to a circuit which can rapidly calculate an error position polynomial by using the Berlekamp-Massey iterative algorithm.

2. Description of the Related Art

In digital communication and storage systems, a Reed-Solomon (hereinafter, referred to as the RS) code for controlling an error has widely been used. In data coded to the RS code, an error is frequently generated during data transmission or reproduction. Since incorrect data is received due to this error, the data coded into the RS code needs to be error-corrected by RS decoding. In this RS decoding process, it is necessary to calculate an error position polynomial having an error position as a root. Examples of such error position polynomial calculation are described in papers, R. E. Blahut, "Theory and Practice of Error Control Code", Addison-Wesley, 1983, and J. L. Massey, "Shift Register Synthesis and BCH Decoding" IEEE Transactions on Information Theory, Vol. IT-15, pp. 122–127, January, 1969. As a circuit using the Berlekamp-Massey algorithm (BMA) to calculate the error position, there is an example using a linear feedback shift register (LFSR) published by Massey, 1965. A discrepancy is calculated from a syndrome and an error position polynomial. If the discrepancy is 0, the previous error position polynomial is used. If it is not 0, the error position polynomial is again calculated. In order to again calculate the error position polynomial, a correction polynomial is given. That is, a new error position polynomial is calculated by using the correcting polynomial and the discrepancy. However, since such a circuit has a parallel structure, many multipliers are required to calculate the error position polynomial, and thus, the size of the circuit is increased. Moreover, since there is a long delay time in a circuit for calculating the discrepancy and a circuit for calculating the error position polynomial using the discrepancy, it is difficult to apply such a conventional circuit to a digital communication system which pursues a high-speed operation or to a storage system which has high storage capacity and requires high-speed access.

SUMMARY OF THE INVENTION

It is an object of the present invention to provide a circuit for calculating an error position polynomial which has a small circuit size and can rapidly calculate an error position polynomial.

To achieve the foregoing and other objects, the error position polynomial is calculated by using the Berlekamp-Massey iterative algorithm of a serial structure to simplify calculation and obtain a high-speed operation.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

In the following description, well known functions and constructions which may obscure the subject matter of the present invention are not described in detail. The following terms are defined in consideration of the function in the present invention and may be varied according to intentions or customs of users and chip designers. Therefore, definitions should be based on the whole contents of the specification.

Figure 1:
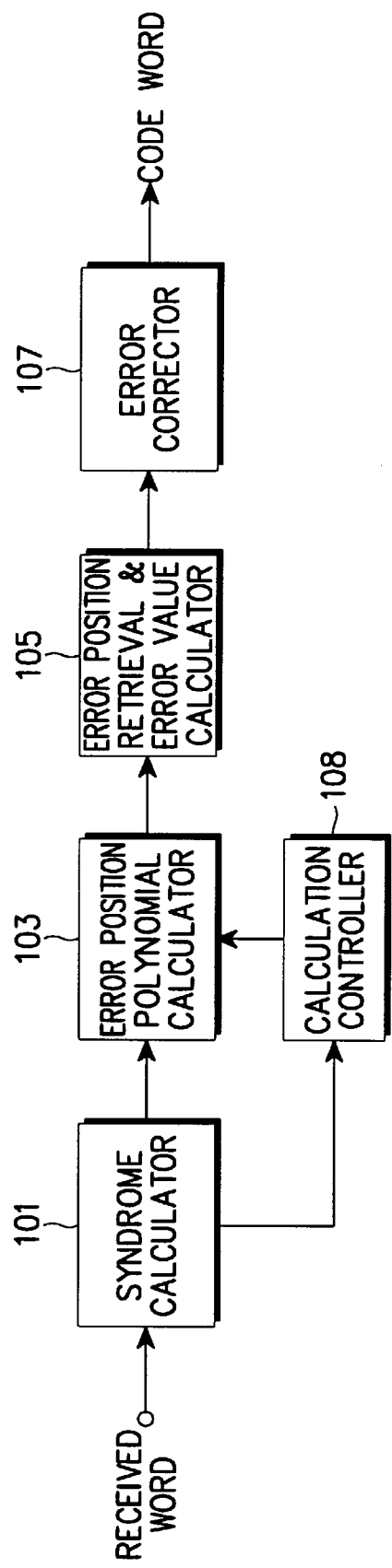
FIG. 1 is a block diagram of an RS code error correcting system according to a preferred embodiment of the present invention.

Referring to FIG. 1, a syndrome calculator 101 calculates a syndrome from a received word. An error position polynomial calculator 103 calculates an error position polynomial from the syndrome calculated by the syndrome calculator 101. An error position retrieval and error value calculator 105 retrieves an error position from the error position polynomial calculated by the error position polynomial calculator 103 and calculates an error value of the retrieved error position. An error corrector 107 corrects an error by adding a symbol of the error position retrieved from the error position retrieval and error value calculator 105 to an error value. A calculation controller 108 generates a control signal by a signal generated from the syndrome calculator 101 so that the error position polynomial calculator 103 can calculate the error position polynomial.

Figure 2:
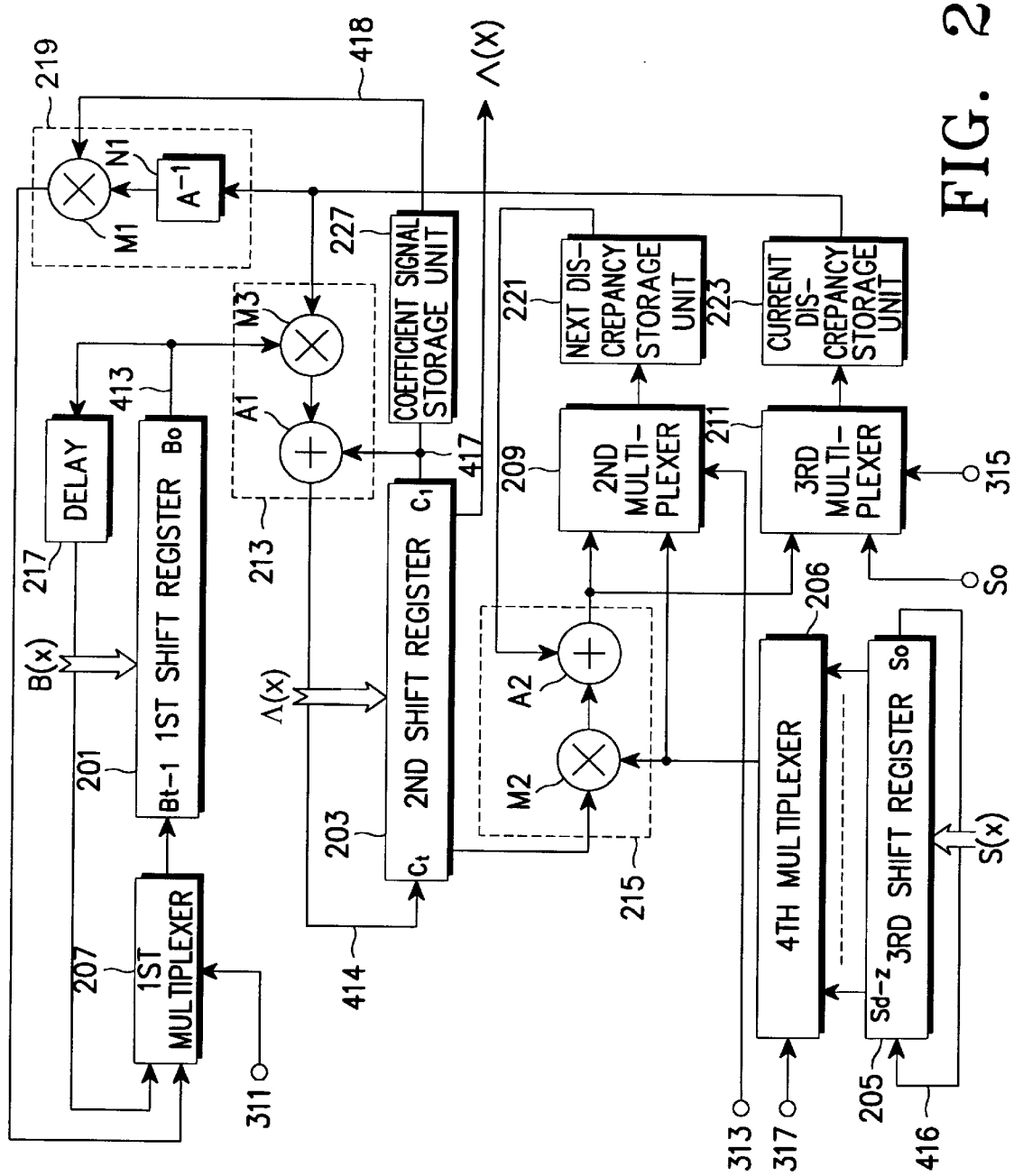
FIG. 2 is a detailed block diagram of an error position polynomial calculator shown in FIG. 1.

FIG. 2 is a detailed block diagram of the error position polynomial calculator 103 shown in FIG. 1. A first shift register 201 stores a correction polynomial B(x). A second shift register 203 stores an error position polynomial $\Lambda(x)$. A third shift register 205 stores a syndrome polynomial S(x). A fourth multiplexer 206 selects one of syndrome symbols generated from the third shift register 205 according to a signal of a syndrome select terminal 317 of the calculation controller 108. A delay 217 delays a symbol byte of the correction polynomial of the first shift register 201. A first operation cell 215 operates a symbol of the error position polynomial of the second shift register 203, a symbol of the syndrome polynomial of the fourth multiplexer 206 and a next discrepancy in a Galois field $GF(2^m)$. A second multiplexer 209 selects one of the output of the first operation cell 215 and the output of the fourth multiplexer 206 according to a signal of an intermediate value storage select terminal 313 of the calculation controller 108.

A next discrepancy storage unit 221 stores an intermediate value in order to calculate the next discrepancy from the output of the second multiplexer 209. A third multiplexer 211 selects one of the output of the first operation cell 215 and a signal of a syndrome coefficient terminal S0 according to a signal of a current discrepancy input select terminal 315 of the calculation controller 108. A current discrepancy storage unit 223 stores a current discrepancy according to the output of the third multiplexer 211. A coefficient signal storage unit 227 stores a coefficient signal from the output of the second shift register 203. A second operation cell 213 performs an operation in the Galois field $GF(2^m)$ by multiplying the output of the first shift register 201 and the output of the current discrepancy storage unit 223 and then adding the multiplied value to the output of the second shift register 203. A third operation cell 219 performs an operation in the Galois field $GF(2^m)$ by dividing the output of the coefficient signal storage unit 227 by the output of the current discrepancy storage unit 223. A first multiplexer 207 selects one of the output of the third operation cell 219 and the output of the delay 217 according to a signal of a condition select terminal 311 of the calculation controller 108 and supplies the selected signal to the first shift register 201.

In RS(N, K, d) representing the RS code, N is a code word length, K is a data word length, and d is a minimum Hamming distance. One of the features of the RS code is that d=N−K+1. N−K designates the number of parities. Assuming that N−K is R, R=d−1. If the number of symbols which can be corrected by this RS code is t, then t=(d−1)/2.

A process of correcting the RS code is as follows. The syndrome is calculated from the received word by the syndrome calculator 101. The error position polynomial is calculated from the syndrome by the error position polynomial calculator 103. The error position is retrieved from the error position polynomial and the error value of the retrieved error position is calculated by the error position retrieval and error value calculator 105. The error is corrected by adding the error position symbol to the error value by the error corrector 107, thereby generating the corrected code word.

Assuming that the syndrome polynomial $S(x)=S_{d-1}x^{d-2}+S_{d-2}x^{d-3}+\ldots+S_0$ and the error position polynomial is represented by:

$$\Lambda(X) = \prod_{i=0}^{v}(1+X_i x) = \Lambda_v X^{v-1} + \ldots + \Lambda_0$$

(where $\Lambda_0=1$ and the highest degree of the error position polynomial is less than or equal to t), and assuming that $\Lambda(x)=1$, $B(x)=1$ and $\gamma=0$, the Berlekamp-Massey algorithm for calculating the error position polynomial is executed by the following steps.

(a). Calculate a discrepancy $\Delta_\gamma$ from the syndrome by the following equation (1):

$$\Delta_\gamma = S_\gamma + \sum_{j=1}^{t}\int_{j=1}^{\gamma} S_{\gamma-j}\left(=\sum_{\gamma=1}^{t}\Lambda_j S_{\gamma-j}\right) \quad (1)$$

(b). Calculate the error position polynomial, as represented by:

$$\Lambda(\gamma+1)(x)=\Lambda^{(\gamma)}(x)+\Delta_\gamma x B^{(\gamma)}(x) \quad (2)$$

(c). If $\Delta_\gamma \neq 0$ and $\deg(B(x)) \geq \deg(\Lambda(x))$, then the correction polynomial $B(x)=\Delta_\gamma^{-1}\Lambda(x)$ and go to the following step (e).

(d). If $\Delta_\gamma=0$ or $\deg(B(x)) \leq \deg\Lambda(x)$, then $B(x)=xB(x)$.

(e). Increase $\gamma$ by 1 (that is, $\gamma=\gamma+1$), and if $\gamma=d-1$, complete the algorithm and if not, return to step (a).

The more detailed description will be given with reference to the above Berlekamp-Massey algorithm (BMA) and FIG. 2.

The first, second and third shift registers 201, 203 and 205 store the correcting polynomial B(x), the error position polynomial $\Lambda(x)$ and the syndrome polynomial S(x), respectively. The delay 217, the next discrepancy storage unit 221 and the current discrepancy storage unit 223 consist of flip-flops for storing the symbol (usually, bytes). The delay 217 delays the output of the first shift register 201. The next and current discrepancy storage units 221 and 223 store the next discrepancy and the current discrepancy, respectively.

The first, second and third operation cells 215, 213 and 219 are cells for the operation in the Galois field $GF(2^m)$. The first and second operation cells 215 and 213 of the same forms multiply two values through their multipliers M2 and M3 and add the multiplied results to another values through their adders A2 and A1, respectively. The third operation cell 211 consisting of an inverse unit N1 and a multiplier M1 executes division by multiplying a reciprocal number of a received value by another value. The syndrome polynomial S(x) is applied to the third shift register 205. The error position polynomial $\Lambda(x)$ is applied to the second shift register 203. A signal 411, which is the output of the third operation cell 219, is obtained by dividing the coefficient signal of the coefficient signal storage unit 227 by the current discrepancy of the current discrepancy storage unit 223. A signal 414, which is the output of the second operation cell 213, is obtained by multiplying the current discrepancy of the current discrepancy storage unit 223 by a coefficient signal 413 generated from the first shift register 201 and then adding the multiplied value to a signal 417 generated from the second shift register 203.

The first multiplexer 207 selects one of the inputs according to the signal of the condition select terminal 311 of the calculation controller 108. That is, if the conditions of the step (c) of the above BMA are satisfied, the first multiplexer 207 selects the output signal 411 of the third operation cell 211, and otherwise, it selects the output signal of the delay 217. The second multiplexer 209 selects the input of the next discrepancy storage unit 221 for storing the intermediate value in order to calculate the discrepancy to be used for the next calculation according to the intermediate value storage select terminal 313 of the calculation controller 108. At the first of a sub iterative period, the second multiplexer 209 selects the output of the fourth multiplexer 206, and otherwise, it selects the output of the first operation cell 215. The third multiplexer 211 selects the input of the current discrepancy storage unit 223 according to the signal of the current discrepancy input select terminal 315. At the first of an iterative period, the third multiplexer 211 selects the signal of the syndrome coefficient terminal S(0), and thereafter, it always selects the output of the first operation cell 215. The fourth multiplexer 206 selects the syndrome signal to be sequentially input to the first operation cell 215 in order to calculate the discrepancy according to the signal of the syndrome select terminal 317 of the calculation control circuit 108. The signal of the syndrome select terminal 317 is selected every main iterative period and fixed at the sub iterative period. At the first sub iterative period, the fourth multiplexer 206 selects syndromes S(1) and S(0), and at the second sub repeating period, it selects syndromes S(2), S(1) and S(0).

In the error position polynomial calculator according to the present invention, the output of the delay 217 is initialized to 0, the first shift register 201 to 1 and the second shift register 203 to 1. The calculation is iterated by 2t (main iterative period) and each main iterative period is iterated by t (sub-iterative period). At the first of the sub iterative period, the output of the delay 217 is always 0, the output of the coefficient signal storage unit 227 is 1, and the current discrepancy storage unit has the output of the first operation cell 215.

Since t=2, it is assumed that there are 4 syndromes S(3), S(2), S(1) and S(0) in order to calculate the error position polynomial of the RS code which can correct a maximum of 2 errors. At the first of the main iterative period, the 4-bit (3:0) output of the third shift register 416 is S(1), S(2), S(3) and S(0); the 2-bit (1:0) output of the first shift register 201 is (0, 1); the output of the delay 217 is 0; the 3-bit (3:0) output of the second shift register 203 is (0, 0, 1); the output of the current discrepancy storage unit 223 is S(0); and the output of the fourth multiplexer 206 is S(1). If the current discrepancy S(0) is 0, the first shift register 201 has its own value through the delay 217. After the sub period, the first shift register 201 has a value obtained by multiplying the output of the first shift register 201 by x through the multiplier M3 of the second operation cell 213. The second shift register 203 maintains its own value. The third shift register 205 has the output of S(3), S(0), S(1) and S(2).

If the current discrepancy S(0) is not 0, the first shift register 201 has a value obtained by dividing the value of the second shift register by the discrepancy. The second shift register 203 has a value obtained by multiplying the discrepancy by the value of the first shift register 201 and then adding the multiplied value to its own value. This has the effect of multiplying x by using the value of the second shift register 203 for the calculation. The third shift register 205 has the above result. The next calculation differs only in the process of calculating the discrepancy. A corresponding signal is selected in the first multiplexer 207 by the signal of the condition select terminal 311 of the calculation controller 108 depending on the conditions of the above step (c) or (d) of the BMA. The values of the first and second shift registers 201 and 203 are calculated as described above.

At the second main period, the fourth multiplexer 206 selects the syndrome S(2). The discrepancy to be used for the next calculation is calculated by multiplying the syndrome S(2) by the new coefficient of the second shift register 203 and then adding the multiplied value to the next discrepancy. At the first of this period, the current discrepancy storage unit 223 latches a discrepancy C(0)S(1)+C(1)S(0) calculated in the first main period so as to be used for calculating the new error position polynomial. The next discrepancy calculated at the second main period is C(0)S(2)+C(1)S(1)+C(2)S(0). The next discrepancy calculated at the third main period is C(0)S(3)+C(1)S(2)+C(2)S(1, and the current discrepancy is the discrepancy calculated at the second main period. Since the fourth main period is the last repeating process, there is no need to be concerned about the next discrepancy and the current discrepancy is the discrepancy calculated at the third main period. The error position polynomial is calculated after 8 (=4×2) clocks (4 main periods and 2 sub periods).

In FIG. 2, although the syndrome polynomial is loaded initially in parallel and outputted in parallel, it may be possible to serially load and serially output the syndrome polynomial as long as timing is permitted.

As described previously, the inventive circuit for calculating the discrepancy and calculating the error position polynomial using the discrepancy is small in circuit size and is rapidly operated by fast clocks (requiring $2t^2$ clocks).

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An error correcting system comprising:
   a syndrome calculator for calculating a syndrome from a received word;
   an error position polynomial calculator for calculating an error position polynomial from said syndrome calculated by said syndrome calculator;
   an error position retrieval and error value calculator for retrieving an error position from the error position polynomial calculated by said error position polynomial calculator and calculating an error value of the retrieved error position;
   an error corrector for correcting an error by adding a symbol of said error position retrieved by said error position retrieval and error value calculator to said error value; and
   a calculation controller for generating a control signal based on a signal generated by said syndrome calculator and providing said control signal to said error position polynomial calculator for calculating said error position polynomial, wherein said error position polynomial calculator comprises:
      a correction polynomial storage unit for storing a correction polynomial;
      an error position storage unit for storing an error position polynomial;
      a syndrome polynomial storage unit for storing a syndrome polynomial;
      a syndrome selector for selecting a syndrome symbol of the syndrome polynomial stored by said syndrome polynomial storage unit according to a syndrome select signal provided by said calculation controller;
      a delay for delaying a symbol byte of the correction polynomial stored in said correction polynomial storage unit;
      a first operation cell for performing a logic operation on a symbol of the error position polynomial of said error position storage unit, a symbol of the syndrome polynomial of said syndrome selector and a next discrepancy in a Galois field $GF(2^m)$;
      an intermediate value storage selector for selecting an output of said first operation cell and an output of said syndrome selector according to an intermediate value storage select signal provided by said calculation controller;
      a next discrepancy storage unit for storing an intermediate value in order to calculate a next discrepancy from an output of said intermediate value storage selector;
      a current discrepancy input selector for selecting one of the output of said first operation cell and a syndrome coefficient signal according to a current discrepancy input select signal provided by said calculation controller;
      a current discrepancy storage unit for storing a current discrepancy according to an output of said current discrepancy input selector;
      a coefficient signal storage unit for storing a coefficient signal output from said error position storage unit;
      a second operation cell for performing an operation in the Galois field $GF(2^m)$ by multiplying an output of said correction polynomial storage unit and an output of said current discrepancy storage unit, and adding the multiplied value to the output of said error position storage unit;
      a third operation cell for performing an operation in the Galois field $GF(2^m)$ by dividing an output of said coefficient signal storage unit by the output of said current discrepancy storage unit; and
      a condition selector for selecting one of an output of said third operation cell and an output of said delay according to a condition select signal provided by said calculation controller, and supplying the selected signal to said correction polynomial storage unit.

2. An error correcting system as set forth in claim 1, wherein said correction polynomial, error position and syndrome polynomial storage units comprise shift registers.

3. An error correcting system as set forth in claim 1, wherein said delay, coefficient signal storage unit, next discrepancy storage unit and current discrepancy storage unit comprise flip-flops.

4. An error correcting system as set forth in claim 1, wherein said syndrome selector, intermediate value storage selector, current discrepancy input selector and condition selector comprise multiplexers.

5. An error correcting system as set forth in claim 1, wherein each of said first and second operation cells comprises a multiplier and an adder.

* * * * *